United States Patent [19]
Poole

[11] Patent Number: 5,241,282
[45] Date of Patent: Aug. 31, 1993

[54] WIDE DYNAMIC RANGE, LOW POWER, ANALOG-TO-DIGITAL RECEIVER

[75] Inventor: Lynn A. Poole, State College, Pa.

[73] Assignee: The United States of America as represented by the Secretary of the Navy, Washington, D.C.

[21] Appl. No.: 476,163

[22] Filed: Jun. 4, 1974

[51] Int. Cl.$^5$ .......................... G06G 7/24; H03G 7/00; H04B 1/64
[52] U.S. Cl. .................................. 328/145; 307/492; 307/559; 307/520; 307/522; 333/14; 328/171; 328/142
[58] Field of Search .............................. 328/142–145, 328/168–173; 333/14; 179/15 AV; 325/65, 473, 474; 330/149, 151; 307/230, 229, 237, 492, 520, 522, 559

[56] References Cited

U.S. PATENT DOCUMENTS

| | | | |
|---|---|---|---|
| 3,234,404 | 2/1966 | Peters | 328/145 |
| 3,361,975 | 1/1968 | Rorden et al. | 328/145 |
| 3,509,368 | 4/1970 | Pedersen | 307/492 |
| 3,584,232 | 6/1971 | Wallace | 328/145 |
| 3,662,274 | 5/1972 | Pritchard | 328/145 |
| 3,665,215 | 5/1972 | Boronkay | 328/145 |
| 3,757,136 | 9/1973 | Hughes | 307/492 |
| 3,769,611 | 10/1973 | Scaggs | 333/14 |

Primary Examiner—John S. Heyman
Attorney, Agent, or Firm—James V. Tura; James B. Bechtel; Susan E. Verona

[57] ABSTRACT

A low power, wide-dynamic-range, signal compressor is suitable for operation from batteries. The compressor input is compatable with most sensors, resistive, capacitive or inductive and it is capable of compressing 150 db of input dynamic range into a 6 bit digital or 40 db analog signal. The output from the compressor is single valued and satisfactory for driving standard telemetry equipment.

5 Claims, 1 Drawing Sheet

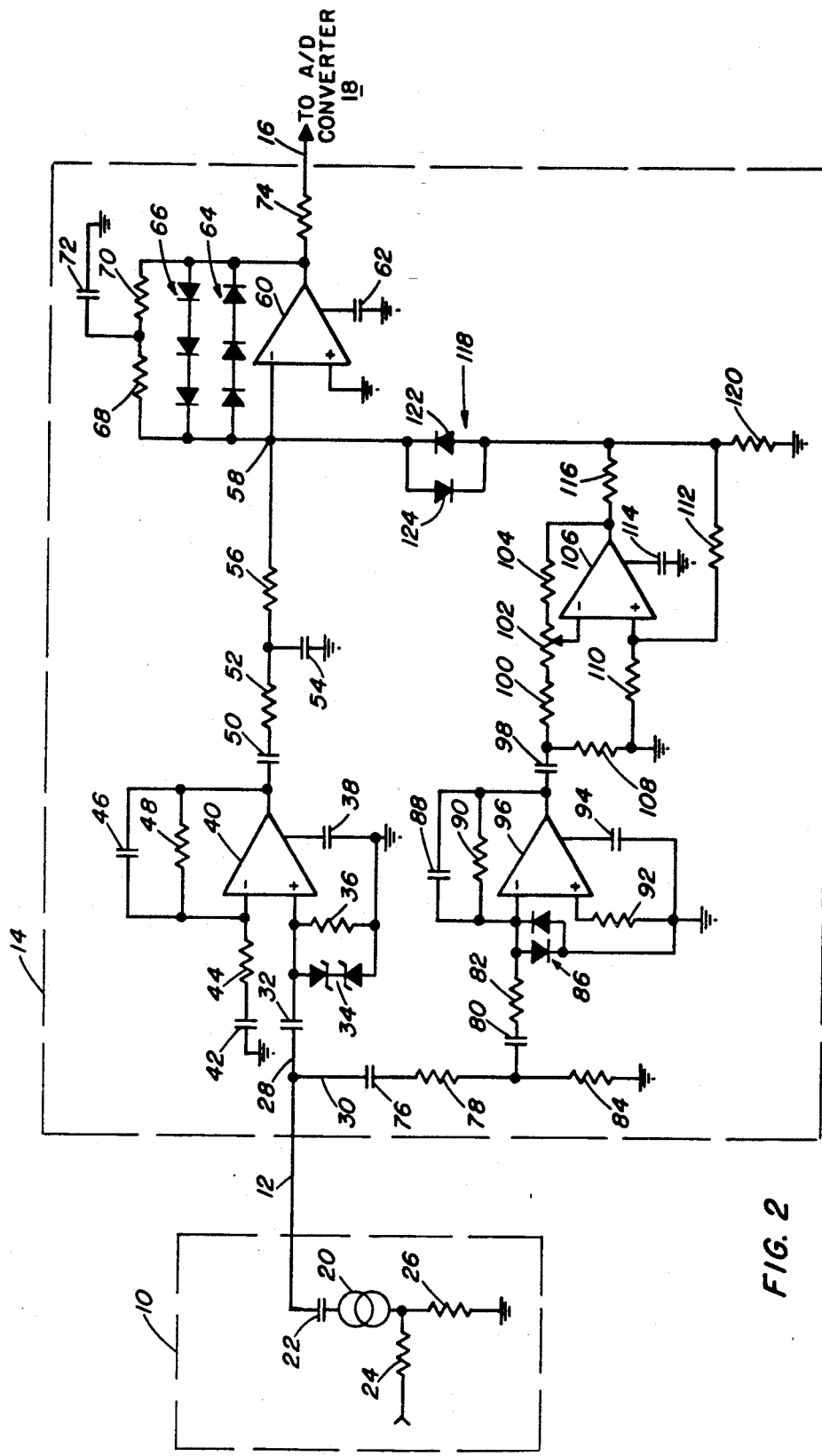

WIDE DYNAMIC RANGE, LOW POWER, ANALOG-TO-DIGITAL RECEIVER

BACKGROUND OF THE INVENTION

A present method of wide dynamic range signal processing or transmission involves a multiple channel approach. Several data channels are used with different input to output gains. This allows each channel to operate on a portion of the input range of the signal. The combination of several channels could be used to provide the data for input signals not covered by any one of the channels. A typical range of coverage for telemetry is approximately 40 db so that coverage of 150 db dynamic range would require about 4 data channels. Unfortunately the power requirements for this multiple channel approach prohibit extended operation from a storage battery.

SUMMARY OF THE INVENTION

It is therefore an object of the invention to reduce the power being dissipated during the processing of wide-dynamic range signals so that the processing apparatus can be operated from a battery source and used in telemetry applications.

Briefly, the present invention accomplishes this and other objects by a solid state signal compressor which pre-conditions the signal before feeding it to an analog-to-digital converter. The circuit includes a separate filtering network for both high and low buffering levels. The filtering for low input levels ($-120$ to $-30$ dB relative to one volt i.e. dBv) is accomplished by a combination of a linear filter associated with a low level buffer, a T network connecting the buffer to a log converter, and an RC feedback network in a log converter stage. Filtering for high level signals ($-30$ to $+30$ dBv) is accomplished by a high level buffer stage in combination with the log converter.

BRIEF DESCRIPTION OF THE DRAWINGS

Other objects, advantages and novel features of the present invention will become apparent from the following detailed description of the invention when considered in conjunction with the accompanying drawings, in which:

FIG. 1 is a block diagram of a typical system incorporating the log compressor of the present invention; and FIG. 2 is a schematic diagram of a log compressor circuit constructed in accordance with the present invention.

DETAILED DESCRIPTION OF THE INVENTION

In FIG. 1, a sensor 10 is shown providing an input via line 12 to a log compressor 14 of the present invention. The signal on input line 12 is preconditioned in the compressor and fed through output line 16 to an analog to digital converter 18. The converter 18 is of conventional design and may be a standard shelf item, although it is preferably a low power type.

A specific circuit of the log compressor 14 is shown in FIG. 2. The sensor 10 may be a hydrophone although it is represented, generally, in the drawing by a source 20 in series with a capacitor 22. Resistor 24 provides a high impedance input to test the voltage level established at resistor 26. Signals detected by sensor 10 are fed via line 12 to the log compressor circuit 14. Once in the compressor 14, low amplitude signals are processed through a low level buffer network connected to lead 28 while the high amplitude signals are conducted through lead 30 to a high level buffer network. In the low level buffer, lead 28 conducts the incoming signals to capacitor 32 which isolates the buffer network from any dc signals in the sensor 10 as well as attenuates the sensor input. Capacitor 32 also helps to isolate limiting diodes 34 which are inserted between capacitor 32 and ground to prevent circuit faults or high voltages from destroying the elements in the low level buffer. Resistor 36 connected to amplifier 40 provides bias current for the amplifier and provides a high pass filter comprised of resistor 36 and capacitor 32. Capacitor 38 connected to operational amplifier 40 provides frequency compensation for the amplifier. A first band pass operation for operational amplifier 40 is performed by capacitor 42 with series resistor 44 which set the low frequency break point, and capacitor 46 with resistor 48 which set the high frequency break point. A second band pass operation is performed by a T-network which follows amplifier 40. Capacitor 50 with resistors 42 and 56 set the low frequency break point while capacitor 54 with resistors 52 and 56 set the high frequency break point. The output from the T-network on line 58 is a current which is conducted as an input to a log converter network consisting of operational amplifier 60 and associated circuit elements. Capacitor 62 provides compensation for operational amplifier 60. The log conversion function is accomplished by two series of diodes in combination with amplifier 60. A first series of diodes 64 permits passage of positive going current while a second series of diodes 66 passes negative current. Log converters are well known in the art and therefore the operation thereof will not be discussed in detail. Basically, however, by appropriately engineering the diode circuit, the current therethrough increases exponentially, and by inverting this operation, a logrighmic output can be obtained. Resistors 68 and 70 with capacitor 72 act as a bias current filter which supplies a dc bias current for the log converter. Resistors 68 and 70 with capacitor 72 also perform a high pass function by attenuating low frequency signals. Resistor 74 is inserted in output line 16 to minimize oscillation of the output signal.

The low level buffer handles signals between the range of $-120$ and $-30$ dBv. At approximately $-30$ dBv, amplifier 40 starts to saturate, prohibiting accurate processing of signals of amplitude greater than $-30$ dBv in the low buffer. However, the dynamic range of the compressor 14 can be increased to approximately $+30$ dBv by a high level buffer connected to line 30 which is designed to produce limited or no output at signals less than $-30$ dBv in amplitude but substantial output in the $-30$ to $+30$ dBv input range. Within the high level buffer, capacitor 76 combines with resistor 78 to perform a high pass operation by setting a low frequency break point. A second independent high pass operation is performed by capacitor 80 and resistor 82 which also set a low frequency break point. Resistor 84 acts as a voltage divider with resistor 78 to attenuate the input signal. Diodes 86 are also included in the high level buffer to prevent excessive voltage from destroying circuit element. Capacitor 88 and resistor 90 set the high frequency break point to complete a band pass operation while resistor 92 provides a bias and capacitor 94 provides compensation for operational amplifier 96, designing it to respond to higher amplitude signals. Any remaining dc component in the amplified signal from amplifier 96 is further reduced by capacitor 98 so that a relatively pure ac signal is fed into a current converter network which follows. Resistors 100, 102, 104 are essentially an accurate potentiometer which precisely regulate the voltage to one input of current conversion amplifier 106. Significant increased accuracy is obtained by using three smaller resistors as a potentiometer instead of a single larger resistor. The voltage to the other input is established by resistors 108, 110, and 112. Capacitor 114 compensates amplifier 106, which then generates a current output proportional to the voltage input and thus acts as a voltage controlled bilateral current source. The gain of the output current is controlled by resistor 116 which connects the output current to a diode crossover switch 118. When the output current reaches a predetermined level, as established by resistor 120, the diode switch conducts the current to the log converter circuit. Diode switch 118 consists of diode 122 which passes positive current swings and diode 124 which conducts current on the negative cycle. Also, at low amplitude levels the combination of resistor 120 with diodes 122 and 124 prevent the noise current associated with the high level circuitry from interfering with the low level performance. The value of resistor 120 is adjusted to a maximum value where the noise current flowing through diodes 122 and 124 is less than the self noise current from the low level buffer. After that point is reached the diode switch 118 conducts a current output from the high level buffer to the log converter.

The log converter, consisting of amplifier 60 and associated elements, provides a bilateral current to voltage conversion with a transfer function of Vo≈VT $$\log_{10} \frac{I_{in}}{I_s},$$

where V is the voltage per degree Kelvin, T is the temperature in degrees Kelvin, $I_{in}$ is the total input current consisting of the current from the low level buffer through the T network (resistors 52 and 56, capacitors 50 and 54) plus the current from the bilateral voltage controlled current source, and $I_s$ is the effective saturation current of feedback diodes 64 and 66. The converter compresses the amplitude of the signals present at its input 58 to a logrithmically proportional smaller amplitude while retaining its frequency.

Typical values for the various elements are given in the table below.

| Element No. | Value |
| --- | --- |
| 22 | .005 μf |
| 24 | 33K Ω |
| 26 | 33 Ω |
| 32 | .001 μf |
| 34 | No. 1N746 |
| 36 | 3.2 Meg Ω |
| 38 | 100 pf |
| 40 | No. LM 308 |
| 42 | .68 μf |
| 44 | 4.99K Ω |
| 46 | 300 pf |
| 48 | 499K Ω |
| 50 | .047 μf |
| 52 | 56K Ω |
| 54 | .0068 μf |
| 56 | 44K |
| 60 | No. LM 308 |
| 62 | 100 pf |

-continued

| Element No. | Value |
| --- | --- |
| 64 | No. 1N4152 |
| 66 | No. 1N4152 |
| 68 | 1 Meg Ω |
| 70 | 1 Meg Ω |
| 72 | .10 μf |
| 74 | 10K Ω |
| 76 | 470 pf |
| 78 | 4.7 Meg Ω |
| 80 | .022 μf |
| 82 | 100K Ω |
| 84 | 100K Ω |
| 86 | No. 1N914 |
| 88 | 100 pf |
| 90 | 2 Meg Ω |
| 92 | 200 K ΩΩ |
| 94 | 100 pf |
| 96 | No. LM 308 |
| 98 | 1.0 μf |
| 100 | 1 Meg Ω |
| 102 | 100K Ω |
| 104 | 2.7 Meg Ω |
| 106 | No. LM 308 |
| 108 | 10K Ω |
| 110 | 1 Meg Ω |
| 112 | 2.7 Meg Ω |
| 114 | 470 pf |
| 116 | 499 Ω |
| 120 | 56K Ω |
| 122 | No. 1N914 |
| 124 | No. 1N914 |

Turning to the operation of the signal compressor 14, signals detected by sensor 10 are fed into log compressor 14. The band pass filters associated with operational amplifiers 40 and 96 restrict the signals processed therethrough to a specific frequency band. The low amplitude signals are processed through the low level buffer (amplifier 40 and associated elements), while the high amplitude signals are processed through the high level buffer (amplifier 96 and associated elements). At approximately −30 dBv amplitude input to the compressor 14 the low level amplifier 40 saturates and the output from the low level buffer levels off. Resistor 120 and diode switch 118 allow the signal current in the high level buffer to exceed the signal current from the low level buffer, when the high level buffer starts to control the log converter. Thus, in the −120 to −30 dBv input range the low level buffer is supplying the input to the log converter. At −30 dBv, the outputs from the low and high buffers to the converter are approximately equal. Between −30 and +30 dBv, the high level buffer controls. The log converter then compresses all signals received at its input into a logarithmic representation of their original amplitude.

Thus there has been described a low power circuit for compressing a wide dynamic range input signal into a relatively narrow dynamic range output signal having equally distinct amplitude values and the same operational frequency.

Obviously, many modifications and variations of the present invention are possible in light of the above teachings. It is therefore to be understood that, within the scope of the appended claims, the invention may be practiced otherwise than as specifically described, and limited only by the following claims.

What is claimed is:

1. A solid state low power signal processor for compressing a wide dynamic range input signal into a narrow range output signal, comprising:

an input signal terminal first and second buffer circuits connected to said input signal terminal for receiving said wide dynamic range input signal, said first buffer circuit being designed for maximum output response with minimum noise currents when said wide dynamic range input signal is within a first preselected amplitude range, said second buffer circuit being designed for maximum output response with minimum noise currents when said wide dynamic range input signal is within a second different preselected amplitude range;

switching means connected in series with the output from said second buffer circuit, said switching means being responsive to the output of said second buffer circuit to block the output from said second buffer circuit when said wide dynamic range input signal is within a first preselected amplitude range, and to conduct the output from said second buffer circuit when said wide dynamic range input signal is within a second different preselected amplitude range; and log converter means connected to the output from said first buffer circuit and to the output from said switching means for converting said outputs to a logarithmic representation of their actual amplitude.

2. The signal processor of claim 1 wherein said first buffer circuit comprises a first operational amplifier compensated to conduct a discrete output for input signals within said first preselected amplitude range, said first operational amplifier saturating when the input signals are above said first preselected signal range thereby conducting a continuous output.

3. The signal processor of claim 1 wherein said second buffer circuit comprises a second operational amplifier compensated to conduct a discrete output for input signals within said second different preselected amplitude range.

4. The signal processor of claim 1 wherein said switching means comprises a pair of diodes, one diode conducting positive current and the other conducting negative current, said diodes being biased to conduct only when the output from said second buffer circuit is within said second preselected amplitude range.

5. The signal processor of claim 1 wherein said first and second buffer circuits further include filtering networks for limiting the received signals to a specific frequency band.

* * * * *